United States Patent
Borkenhagen et al.

(10) Patent No.: US 6,442,102 B1
(45) Date of Patent: Aug. 27, 2002

(54) METHOD AND APPARATUS FOR IMPLEMENTING HIGH SPEED DDR SDRAM READ INTERFACE WITH REDUCED ACLV EFFECTS

(75) Inventors: John Michael Borkenhagen; Todd Alan Greenfield, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 09/825,825

(22) Filed: Apr. 4, 2001

(51) Int. Cl.$^7$ .................................................. G11C 8/00
(52) U.S. Cl. ................... 365/233; 365/194; 365/230.02
(58) Field of Search ........................... 365/233, 230.02, 365/194

(56) References Cited

U.S. PATENT DOCUMENTS 6,147,927 A * 11/2000 Ooishi ........................ 365/233
6,316,980 B1 * 11/2001 Vogt et al. .................. 327/241

* cited by examiner

Primary Examiner—Huan Hoang
(74) Attorney, Agent, or Firm—Joan Pennington

(57) ABSTRACT

A method and apparatus are provided for implementing high speed double data rate (DDR) synchronous dynamic random access memory (SDRAM) read interface with reduced across chip line-width variation (ACLV) effects. A delay circuit is utilized for providing a delay output. A calibration clock input is applied to the delay circuit during calibration. A DQS input is applied to the delay circuit following the calibration. Calibration circuitry is utilized for receiving the delay output from the delay circuit and providing a calibration result during calibration. The delay circuit is operatively controlled for providing the delay output responsive to the calibration result. A programmable compensated delay apparatus includes a delay circuit operatively controlled for providing a delay output. Calibration logic provides a calibration clock input and is coupled to the delay circuit for receiving the delay output and providing a calibration result. A multiplexer coupled to the delay circuit receives a first input and the calibration clock input. Multiplexer selectively applies the calibration clock input to the delay circuit during calibration and applies the first input to the delay circuit following the calibration. A programmable delay register provides a desired delay value. A conversion logic coupled to the calibration logic and the programmable delay register receives both the calibration result and the desired delay value. The conversion logic provides a control output to the delay circuit.

18 Claims, 2 Drawing Sheets

METHOD AND APPARATUS FOR IMPLEMENTING HIGH SPEED DDR SDRAM READ INTERFACE WITH REDUCED ACLV EFFECTS

FIELD OF THE INVENTION

The present invention relates generally to the data processing field, and more particularly, relates to a method and apparatus for implementing high speed double data rate (DDR) synchronous dynamic random access memory (SDRAM) read interface with reduced across chip line-width variation (ACLV) effects.

DESCRIPTION OF THE RELATED ART

DDR SDRAMs use a source synchronous interface for reading and writing data. The source synchronous clock strobe on DDR SDRAMs is named DQS. When data is read from a DDR SDRAM, the DQS clock strobe is driven by the SDRAM. The SDRAM edge aligns the DQS clock strobe with the data. It is the responsibility of the device receiving SDRAM read data to delay the incoming DQS and center the incoming DQS in the middle of the incoming data. Strobe centering relative to data is required to handle skew uncertainty between the DQS and data coming out of the SDRAM, as determined by the SDRAM specification. It is also required to handle skew uncertainty created by card wiring, card loading, and inter-signal interference (ISI). Lastly, DQS centering is required to support the data latch setup and hold times.

When DDR interfaces are operated at high frequencies, tight tolerance is required for the circuitry used to implement the delay of DQS. A common method to account for process variation effects on DQS delay between different manufactured chips is to calibrate DQS delay with reference circuitry during system operation.

U.S. Patent Application Ser. No. 09/617,558 filed Jul. 17, 2000 entitled PROGRAMMABLE COMPENSATED DELAY FOR DDR SDRAM INTERFACE and assigned to the present assignee discloses a programmable compensated delay for a double data rate (DDR) synchronous dynamic random access memory (SDRAM) interface. A programmable compensated delay apparatus includes a reference delay calibration circuit for providing a measured number of delay elements in one cycle. A programmable delay register provides a desired delay value. A conversion logic is coupled to the reference delay calibration circuit and the programmable delay register for receiving both the measured number of delay elements in one cycle and the desired delay value. The conversion logic provides a number of required delay elements. A delay circuit is coupled to the conversion logic for receiving the number of required delay elements and providing the desired delay. A SDRAM control logic provides a refresh start signal to the reference delay calibration circuit for updating the delay circuit during each DRAM refresh. The DQS clock strobe on the DDR SDRAM is applied to the delay circuit and is delayed by the desired delay. The subject matter of the above-identified patent application is incorporated herein by reference, as a part hereof.

In the above-identified arrangement, the reference delay calibration circuit and the delay circuit providing DQS delay use separate physical delay elements. Delay elements are composed of transistors. Although the design of the transistors is identical in the reference delay calibration circuit and the delay circuit providing DQS delay, processing variations occur due to variations on the silicon die in lithography, non-uniform dopant levels, non-uniform etching characteristics, and the like. As used in the following description and claims, the term across chip line-width variation (ACLV) effects include these processing variations lumped together. ACLV can result in two delay elements composed with identical transistor designs to have different delay characteristics. For example, ACLV mistracking between identical transistor designs may be +/−20%.

ACLV mistracking can result in the actual DQS delay elements being either slower or faster than the reference calibration circuitry delay elements. The 20% ACLV uncertainty translates into 20% degradation in the potential DDR SDRAM data transfer rate. This directly impacts on both the latency and bandwidth of DDR SDRAM interfaces.

While the above-identified patent application provides improvements over known arrangements, a need exists for a mechanism for implementing high speed double data rate (DDR) synchronous dynamic random access memory (SDRAM) read interface with reduced across chip line-width variation (ACLV) effects.

SUMMARY OF THE INVENTION

A principal object of the present invention is to provide a method and apparatus for implementing high speed double data rate (DDR) synchronous dynamic random access memory (SDRAM) read interface with reduced across chip line-width variation (ACLV) effects. Other important objects of the present invention are to provide such method and apparatus for implementing high speed double data rate (DDR) synchronous dynamic random access memory (SDRAM) read interface with reduced across chip line-width variation (ACLV) effects substantially without negative effect and that overcome many of the disadvantages of prior art arrangements.

In brief, a method and apparatus are provided for implementing high speed double data rate (DDR) synchronous dynamic random access memory (SDRAM) read interface with reduced across chip line-width variation (ACLV) effects. A delay circuit is utilized for providing a delay output. A calibration clock input is applied to the delay circuit during calibration. A DQS input is applied to the delay circuit following the calibration. A calibration circuitry is utilized for receiving the delay output from the delay circuit and providing a calibration result during calibration. The delay circuit is operatively controlled for providing the delay output responsive to the calibration result.

A programmable compensated delay apparatus includes a delay circuit operatively controlled for providing a delay output. A calibration logic provides a calibration clock input and is coupled to the delay circuit for receiving the delay output and providing a calibration result. A multiplexer coupled to the delay circuit receives a first input and the calibration clock input. Multiplexer selectively applies the calibration clock input to the delay circuit during calibration and applies the first input to the delay circuit following the calibration. A programmable delay register provides a desired delay value. A conversion logic coupled to the calibration logic and the programmable delay register receives both the calibration result and the desired delay value. The conversion logic provides a control output to the delay circuit.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
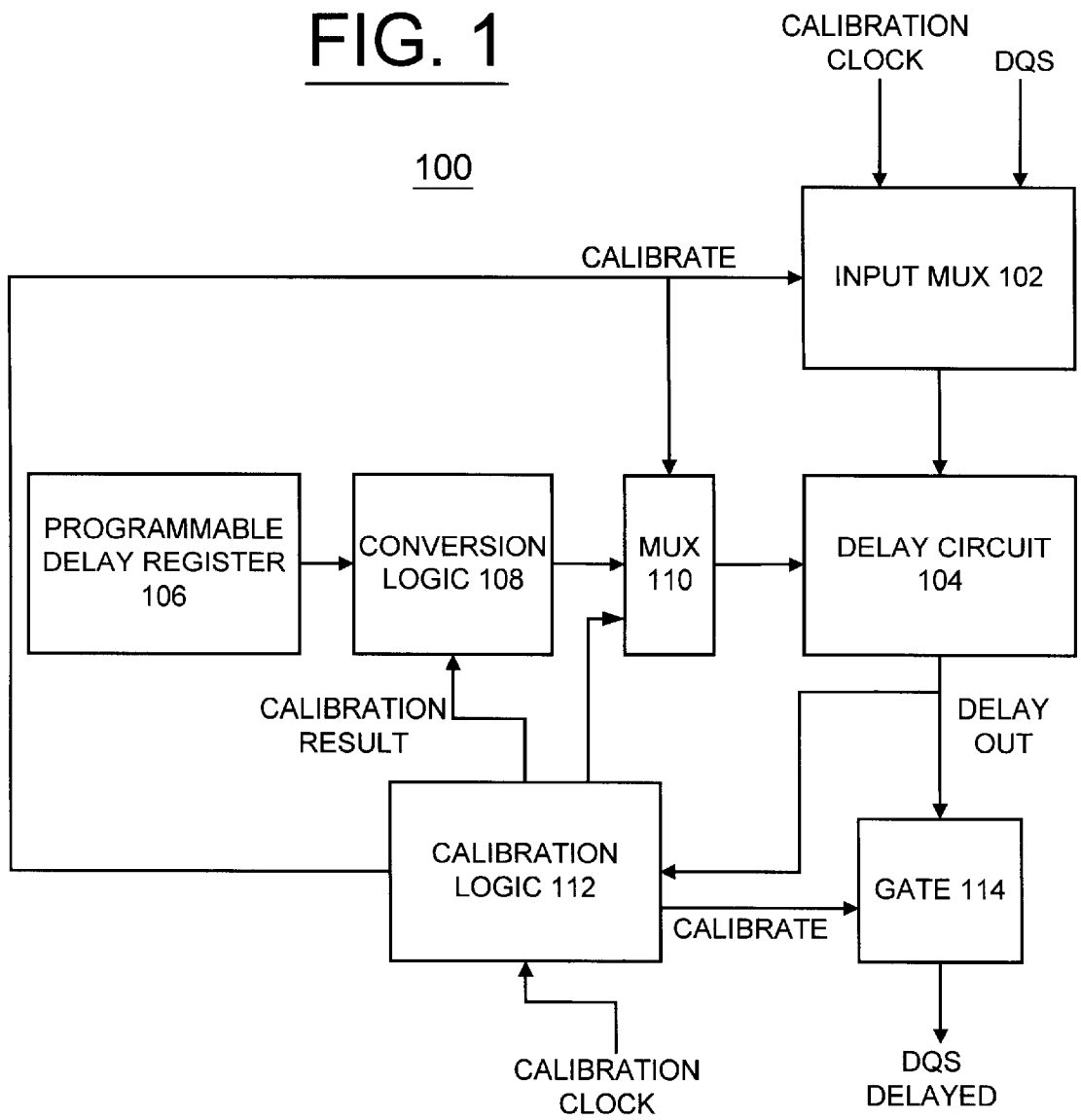
FIG. 1 is a block diagram representation illustrating an apparatus for implementing high speed double data rate (DDR) synchronous dynamic random access memory (SDRAM) read interface with reduced across chip line-width variation (ACLV) effects in accordance with the preferred embodiment.

Having reference now to the drawings, in FIG. 1, there is shown an apparatus for implementing high speed double data rate (DDR) synchronous dynamic random access memory (SDRAM) read interface with reduced across chip line-width variation (ACLV) effects in accordance with the preferred embodiment generally designated by the reference character 100. Apparatus 100 includes an input multiplexer (MUX) 102, a delay circuit 104, a programmable delay register 106, conversion logic 108, a multiplexer 110, calibration logic 112 and a gate 114. The delay circuit 104 is operatively controlled for providing a delay output labeled DELAY OUT. The calibration logic 112 provides a calibrate control input labeled CALIBRATE to the multiplexer 102, multiplexer 110 and the gate 114 for calibration. The calibration logic 112 receives the delay output from the delay circuit 104 and applied a calibration control to the delay circuit 104 via multiplexer 110 during calibration and provides a calibration result to the conversion logic 108. The multiplexer 102 receives a DQS input and the calibration clock input and selectively applies the calibration clock input to the delay circuit 104 during calibration and applies the DQS input to the delay circuit 104 following the calibration. The programmable delay register 106 provides a desired delay value. The conversion logic 108 is coupled to the calibration logic 112 and the programmable delay register 106 receiving both the calibration result and the desired delay value. Conversion logic 108 provides a control output to the delay circuit 104 via multiplexer 110 following calibration.

In accordance with features of the preferred embodiment, ACLV effects are effectively eliminated in the DQS delay apparatus 100. This is accomplished by using the same physical delay elements of delay circuit 104 for both the reference calibration logic path and the DQS delay path. The reference calibration logic path uses the DQS delay elements of delay circuit 104 for calibration during periods that the delay elements are not needed by the functional DQS interface. This provides, for example, a 20% improvement in the data transfer rate of DDR SDRAM interfaces.

Apparatus 100 uses the delay circuit 104 for both calibration and to delay an input signal. Calibration logic 112 controls the delay circuit 104 when it is not being used to delay the input signal. The multiplexer 102 is used to select the calibration input or the DQS input to the delay circuit 104. Programmable delay register 106 and conversion logic 108 are used to convert the calibration result to the desired DQS delay.

In the DDR SDRAM application, the calibration must not be active during read commands so that DQS can latch to the incoming data. Calibration can occur whenever there are no read operations active. In apparatus 100, calibration is implemented to run during each refresh command.

Figure 2:
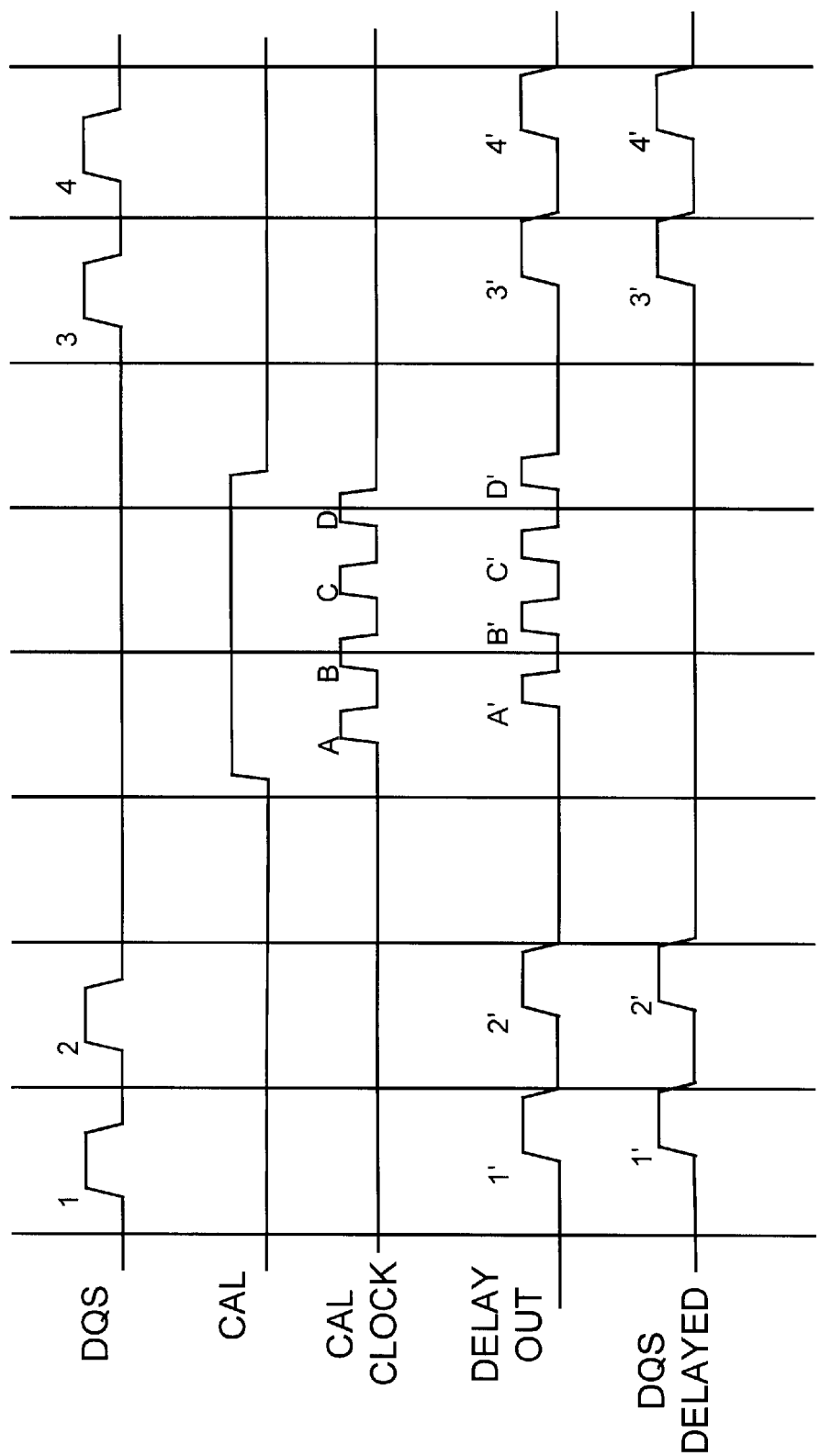
FIG. 2 is a timing diagram for the apparatus of FIG. 1 in accordance with the preferred embodiment.

Referring also to FIG. 2, there is shown a timing diagram for the apparatus 100 of FIG. 1 in accordance with the preferred embodiment. The functional input DQS is shown at the top of the diagram including pulses labeled 1–4. At the beginning of calibration, an illustrated CALIBRATE signal is activated that selects the input to the delay circuit 104. At the beginning of calibration, the input multiplexer 102 is switched to select the calibration input signal. A calibration clock is shown by pulses labeled A, B, C, D during the active CALIBRATE signal. The delay out of delay circuit 104 is illustrated by delay out pulses labeled A', B', C', D' during the active CALIBRATE signal. DQS delayed is shown by delay out pulses labeled 1', 2', 3' and 4'. The DQS is required to be inactive when calibrate is active, as shown in FIG. 2. The delay out of delay circuit 104 is gated by gate 114 to keep calibration clock from being propagated to DQS delayed, as shown at the bottom of FIG. 2. During calibration, the delay circuit 104 is controlled by the calibration logic 112 via multiplexer 110, which updates the delay each clock cycle until it matches the pulse width of the calibration input. The input multiplexer 102 is switched back to select the DQS input signal when the CALIBRATE signal goes inactive until the next calibration cycle.

The programmable delay register 106 is written by software, normally at power-on initialization time. The value written in to the programmable delay register 106 can be a binary representation of the desired delay value, or a binary representation of an offset from the cycle time that results in the desired delay value. Conversion logic 108 inputs the calibration result and the binary representation of the desired delay value. The output of conversion logic 108 is latched and used to control the delay circuit 104 when calibration is not running. The function implemented by the conversion logic is necessary to allow fine-tuning of the desired delay based, for example, on laboratory measurement. Conversion logic 108 is also required if the desired delay is not the same as the pulse width of the calibration input.

In summary, apparatus 100 for implementing high speed double data rate (DDR) synchronous dynamic random access memory (SDRAM) read interface with reduced across chip line-width variation (ACLV) effects in accordance with the preferred embodiment uses the same physical delay circuit 104 for both reference calibration and DQS delay on DDR SDRAM interfaces. Physical delay circuit 104 is used for calibration during times when there are no read operations active and is not used for DQS delay. This results in up to a 20% improvement in the data transfer rate, improving both bandwidth and latency on DDR SDRAM interfaces.

While the present invention has been described with reference to the details of the embodiments of the invention shown in the drawing, these details are not intended to limit the scope of the invention as claimed in the appended claims.

What is claimed is:

1. Apparatus for implementing high speed double data rate (DDR) synchronous dynamic random access memory (SDRAM) read interface with reduced across chip line-width variation (ACLV) effects comprising:

a delay circuit operatively controlled for providing a delay output;

a calibration logic for providing a calibration clock input and coupled to said delay circuit for receiving said delay output and providing a calibration result;

a multiplexer coupled to said delay circuit; said multiplexer receiving a DQS input and said calibration clock input and selectively applying said calibration clock input to said delay circuit during calibration and applying said DQS input to said delay circuit following said calibration;

a programmable delay register for providing a desired delay value;

a conversion logic coupled to said calibration logic and said programmable delay register for receiving both said calibration result and said desired delay value; and said conversion logic for providing a control output to said delay circuit.

2. Apparatus for implementing high speed double data rate (DDR) synchronous dynamic random access memory (SDRAM) read interface as recited in claim 1 wherein said multiplexer receives a calibration control input for applying said calibration clock input to said delay circuit during calibration when no read operations are active.

3. Apparatus for implementing high speed double data rate (DDR) synchronous dynamic random access memory (SDRAM) read interface as recited in claim 1 wherein said programmable delay register is a software written register.

4. Apparatus for implementing high speed double data rate (DDR) synchronous dynamic random access memory (SDRAM) read interface as recited in claim 1 wherein said programmable delay register is written by software at power-on initialization.

5. Apparatus for implementing high speed double data rate (DDR) synchronous dynamic random access memory (SDRAM) read interface as recited in claim 1 wherein said delay circuit is operatively controlled by said calibration logic for updating said delay output each clock cycle until said delay output matches a pulse width of the calibration clock input.

6. Apparatus for implementing high speed double data rate (DDR) synchronous dynamic random access memory (SDRAM) read interface as recited in claim 1 wherein said control output of said conversion logic is latched and used to control said delay circuit following said calibration.

7. Apparatus for implementing high speed double data rate (DDR) synchronous dynamic random access memory (SDRAM) read interface as recited in claim 1 wherein said calibration occurs when a delayed DQS is not used.

8. A method for implementing high speed double data rate (DDR) synchronous dynamic random access memory (SDRAM) read interface with reduced across chip linewidth variation (ACLV) effects comprising the steps of:

utilizing a delay circuit for providing a delay output;

applying a calibration clock input to said delay circuit during calibration;

applying a DQS input to said delay circuit following said calibration;

utilizing calibration circuitry, receiving said delay output from said delay circuit and providing a calibration result during calibration; and operatively controlling said delay circuit for providing said delay output responsive to said calibration result.

9. A method for implementing high speed double data rate (DDR) synchronous dynamic random access memory (SDRAM) read interface as recited in claim 8 includes the step of providing a programmable delay register for providing a desired delay value and a conversion logic coupled to said calibration circuitry and said programmable delay register for receiving both said calibration result and said desired delay value; and said conversion logic for providing a control output to said delay circuit.

10. A method for implementing high speed double data rate (DDR) synchronous dynamic random access memory (SDRAM) read interface as recited in claim 9 includes the step of writing said programmable delay register with said desired delay value by software at power-on initialization.

11. A method for implementing high speed double data rate (DDR) synchronous dynamic random access memory (SDRAM) read interface as recited in claim 9 includes the step of latching said control output of said conversion logic for controlling said delay circuit following said calibration.

12. A method for implementing high speed double data rate (DDR) synchronous dynamic random access memory (SDRAM) read interface as recited in claim 8 wherein said calibration occurs when a delayed DQS is not used.

13. A programmable compensated delay apparatus comprising:

a delay circuit operatively controlled for providing a delay output;

a calibration logic for providing a calibration clock input and coupled to said delay circuit for receiving said delay output and providing a calibration result;

a multiplexer coupled to said delay circuit; said multiplexer receiving a first input and said calibration clock input and selectively applying said calibration clock input to said delay circuit during calibration and applying said first input to said delay circuit following said calibration;

a programmable delay register for providing a desired delay value;

a conversion logic coupled to said calibration logic and said programmable delay register for receiving both said calibration result and said desired delay value; and said conversion logic for providing a control output to said delay circuit.

14. A programmable compensated delay apparatus as recited in claim 13 wherein said first input includes a DQS input of a high speed double data rate (DDR) synchronous dynamic random access memory (SDRAM) read interface.

15. A programmable compensated delay apparatus as recited in claim 13 wherein said programmable delay register is a software written register.

16. A programmable compensated delay apparatus as recited in claim 13 wherein said programmable delay register is written by software at power-on initialization.

17. A programmable compensated delay apparatus as recited in claim 13 wherein said delay circuit is operatively controlled by said calibration logic for updating said delay output each clock cycle until said delay output matches a pulse width of the calibration clock input.

18. A programmable compensated delay apparatus as recited in claim 13 wherein said control output of said conversion logic is latched and used to control said delay circuit following said calibration.

\* \* \* \* \*